United States Patent [19]
Liang et al.

[11] Patent Number: 5,372,957
[45] Date of Patent: Dec. 13, 1994

[54] MULTIPLE TILTED ANGLE ION IMPLANTATION MOSFET METHOD

[75] Inventors: Mong-Song Liang, Cupertino, Calif.; Chue-San Yoo, Taipei; Mou-shiung Lin, Hsinchu, both of Taiwan, Prov. of China

[73] Assignee: Taiwan Semiconductor Manufacturing Company, Hsinchu, Taiwan, Prov. of China

[21] Appl. No.: 94,747

[22] Filed: Jul. 22, 1993

[51] Int. Cl.⁵ .......................... H01L 21/265
[52] U.S. Cl. ........................ 437/35; 437/44; 437/907; 257/344
[58] Field of Search ............... 437/44, 35, 909, 913; 257/344

[56] References Cited

U.S. PATENT DOCUMENTS

| | | | |
|---|---|---|---|
| 4,771,012 | 9/1988 | Yabu et al. | 437/29 |
| 5,073,514 | 12/1991 | Ito et al. | 437/44 |
| 5,147,811 | 9/1992 | Sakagami | 437/35 |
| 5,158,901 | 10/1992 | Kosa et al. | 437/40 |
| 5,217,910 | 6/1993 | Shimizu et al. | 437/30 |
| 5,258,319 | 11/1993 | Inuishi et al. | 437/44 |
| 5,262,337 | 11/1993 | Kim | 437/44 |

FOREIGN PATENT DOCUMENTS

| | | | |
|---|---|---|---|
| 0292833 | 12/1990 | Japan | 437/44 |
| 403272145A | 12/1991 | Japan | 437/44 |
| 404192337 | 7/1992 | Japan | 437/35 |

OTHER PUBLICATIONS

Wolf et al., "Silicon Processing for the VLSI Era, vol. I, Process Technology", pp. 303–308, 1986.
"$\frac{1}{4}\mu m$ LATID (Large-Tilted-Angled Implanted Drain) Technology" by T. Hori, published in IEDM '89, pp. 777/780.
"Graded–Junction Gate/N–Overlapped LDD MOSFET Structures For High Hot–Carrier Reliability" by Y. Okumura et al, published in IEEE Transactions on Electron Devices, vol. 38, No. 12, Dec. 1991, pp. 2647–2656.

*Primary Examiner*—Olik Chaudhuri
*Assistant Examiner*—Richard A. Booth
*Attorney, Agent, or Firm*—George O. Saile

[57] ABSTRACT

A method is described for fabricating a lightly doped drain MOS FET integrated circuit device which is useful for sub-half micron ground rules integrated circuits. A pattern of gate electrode structures is formed upon a semiconductor substrate which structures each includes a gate oxide and a polysilicon layer. A pattern of lightly doped regions in the substrate are formed under the structures by multiple ion implantations. After the ion implantations the lightly doped regions are annealed at a temperature and time to cause a critical and desired dopant diffusion. A dielectric spacer structure is formed upon the sidewalls of each of the structures and over the adjacent portions of the substrate. A pattern of heavily doped regions is formed in the substrate adjacent to the dielectric spacer structure on the sidewalls of the structures and over the adjacent portions of the substrate which form lightly doped drain source/drain structures of an MOS FET device to form said integrated circuit device.

13 Claims, 5 Drawing Sheets

MULTIPLE TILTED ANGLE ION IMPLANTATION MOSFET METHOD

BACKGROUND OF THE INVENTION

1. Field of the Invention

The invention relates to a method for manufacturing a highly dense integrated circuit using multiple angles tilted from vertical ion implantation to form the source/drain regions of a field effect device.

2. Description of the Prior Art

As the integrated circuit technology increases its device density and attempts to improve its circuit and device performances workers in the field are faced with difficult device design choices. This is particularly the situation in the metal oxide semiconductor field effect transistor, MOSFET integrated circuit device technology.

The lightly doped drain, LDD structure has long been very effectively used in the MOSFET integrated circuit technology to improve device performance. However, as the device density increases there is serious problems involving the use of such a technology. One important factor involves the gate electrode to source/drain overlap. This is a highly preferred structure and is difficult to control with shorter channel width in the more advanced devices. Using the usual vertical ion implantation N− or P− process there is little overlap, even after the drive-in step to activate the implanted ions. Workers in the field have used a longer thermal drive-in or higher temperature to increase the overlap. However, this increases the chance of device punch-through problems.

There is a technology called large tilted angle ion implantation which allows ion implantation to be performed at angles other than the vertical, that is 0°. This technique has been used to make various MOSFET LDD integrated circuit devices. The U.S. Pat. No. 4,771,012 to Yabu et al; U.S. Pat. No. 5,073,514 to Ito et al; U.S. Pat. No. 5,158,901 to Kosa et al and U.S. Pat. No. 5,147,811 all show the use of tilted angle ion implantation to make integrated circuit devices. The publications "¼ um LATID (LArge-Tilt-angle Implanted Drain) TECHNOLOGY" by T. Hori, published in IEDM 89 pages 777/780 and "GRADED-JUNCTION GATE/N− OVERLAPPED LDD MOSFET STRUCTURES FOR HIGH HOT-CARRIER RELIABILITY" by Y. Okumura et al published in IEEE Transactions on Electron Devices, Vol. 38, No. 12, Dec. 1991, pages 2647–2656 show further use of tilted angle ion implantation. These references all use a single tilted angle ion implantation to improve device performance.

FIG. 1A and 1B illustrate a Prior Art MOSFET LDD structure and the dopant concentration vs junction depth, respectively. The device includes the gate dielectric 12, gate electrode 14, sidewall spacers 20, LDD N− regions, and N+ source/drain regions.

These conventional LDD structures will encounter hot carrier problems when device geometry continues to shrink. That is, when the channel length is decreased the voltage drop across the channel remains the same. For example, 5 volts would increase the electrical field across the channel. This causes hot carrier problems, and transconductance degrades. Namely, the device saturation current decreases with time under operating conditions.

It is therefore a principal object of this invention to increase the gate electrode to source/drain overlap without undue use of thermal drive-in and while maintaining a smaller substrate resistance, Rs.

It is a further object of the invention to increase the gate electrode to source/drain overlap by use of multiple tilted angle ion implantation to cause a gradual change in doping concentration in the overlap which results in a lower electrical field thereby improving hot carrier performance.

SUMMARY OF THE INVENTION

A method is described for fabricating a very manufacturable lightly doped drain MOS FET integrated circuit device which is useful for sub-half micron ground rules integrated circuits. A pattern of gate electrode structures is formed upon a semiconductor substrate which structures each include a gate oxide and a polysilicon layer. A pattern of lightly doped regions in the substrate are formed under the structures by multiple ion implantations. After the ion implantations the lightly doped regions are annealed at a temperature and time to cause a critical and desired dopant diffusion. A dielectric spacer structure is formed upon the sidewalls of each of the structures and over the adjacent portions of the substrate. A pattern of heavily doped regions is formed in the substrate adjacent to the dielectric spacer structure on the sidewalls of the structures and over the adjacent portions of the substrate which form lightly doped drain source/drain structures of an MOS FET device to form said integrated circuit device.

A MOSFET integrated circuit device structure is described which has a pattern of gate electrode structures upon a semiconductor substrate which structures each include a gate oxide and a polysilicon layer. A pattern of lightly doped regions is located in the substrate under and adjacent to the structure wherein a gradual reduced dopant concentration is present as the lightly doped regions extend under gate electrode structures. A dielectric spacer structure is upon the sidewalls of each of the structures and over the adjacent portions of the substrate. A pattern of heavily doped regions is located in the substrate adjacent to the dielectric spacer structure on the sidewalls of the structures and over the adjacent portions of the substrate which form lightly doped drain source/drain structures of an MOS FET device to form the integrated circuit device.

DESCRIPTION OF THE PREFERRED EMBODIMENTS

Referring now more particularly to FIGS. 4 through 7, there is shown a method for making the lightly doped drain device of the present invention. The first series of steps involve the formation of the dielectric isolation regions for isolating semiconductor surface regions from other such regions in the semiconductor substrate 11. The semiconductor substrate is preferably composed of silicon having a (100) crystallographic orientation. In an effort to simplify the description and the drawings the dielectric isolation 10 between devices will not be described in detail, because they are conventional. For example, one method is described by E. Kooi in his U.S. Pat. No. 3,970,486 wherein certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide. Then semiconductor devices can be provided in the silicon mesas according to the following processes.

The surface of the silicon substrate 11 is thermally oxidized to form the desired gate oxide 12 thickness. The preferred thickness is between about 100 to 200 Angstroms. The polysilicon layer 14 is blanket deposited by pyrolyzing silane between about 600° and 700° C. as is conventionally done. The preferred thickness of the polysilicon layer 14 is between about 3000 to 3500 Angstroms. The polysilicon layer 14 is doped with phosphorus under the conditions of using phosphorus oxychloride between about 800° to 875° C. for between about 30 to 60 minutes. Alternatively, P31 could be ion implanted into the polysilicon layer. The resulting layer is cleaned using standard cleaning solution for polysilicon.

Should a polycide gate structure be desired, a refractory metal silicide layer (not shown) is deposited using low pressure chemical vapor deposition over the polysilicon layer 14. The preferred metal silicide is tungsten silicide and the thickness of the metal silicide is between about 1000 to 2000 Angstroms.

Conventional lithography and etching is now used to form a lithographic mask over the polysilicon or polycide layered structure. The mask pattern protects the designated areas to be the gate structures. The masked structure is now exposed to a anisotropic plasma etching ambient of, for example HBr or chlorine based chemistry etchants as is known in the art to remove the unwanted portions of the polysilicon layer 14. The etched gate structure is then oxidized in an oxidizing ambient, to form a silicon oxide layer of about 100 to 200 Angstroms. The silicon oxide serves as the screen oxide for the ensuring and very critical LDD implantation. This results in the FIG. 4 structure.

Figure 5:
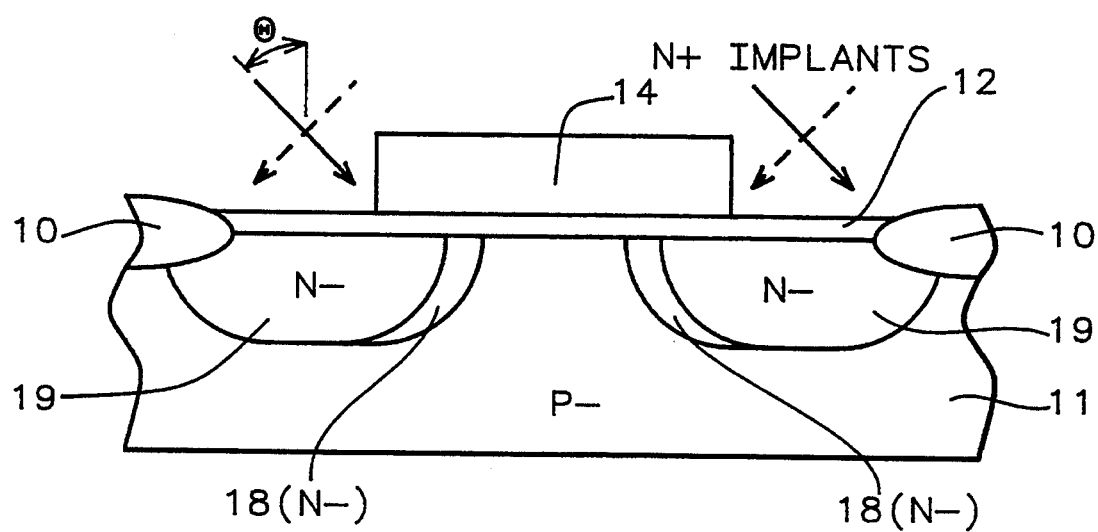
Figure 6:
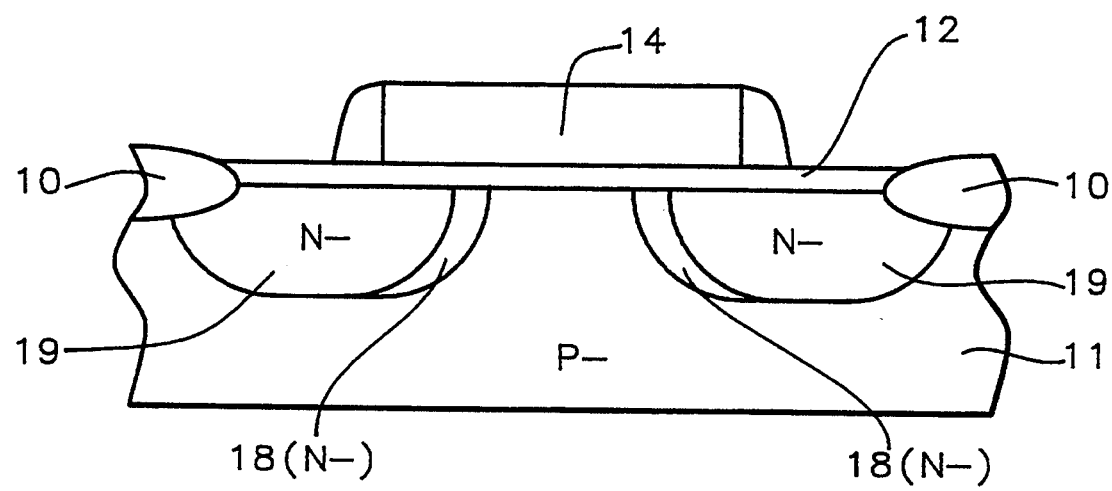
Figure 7:
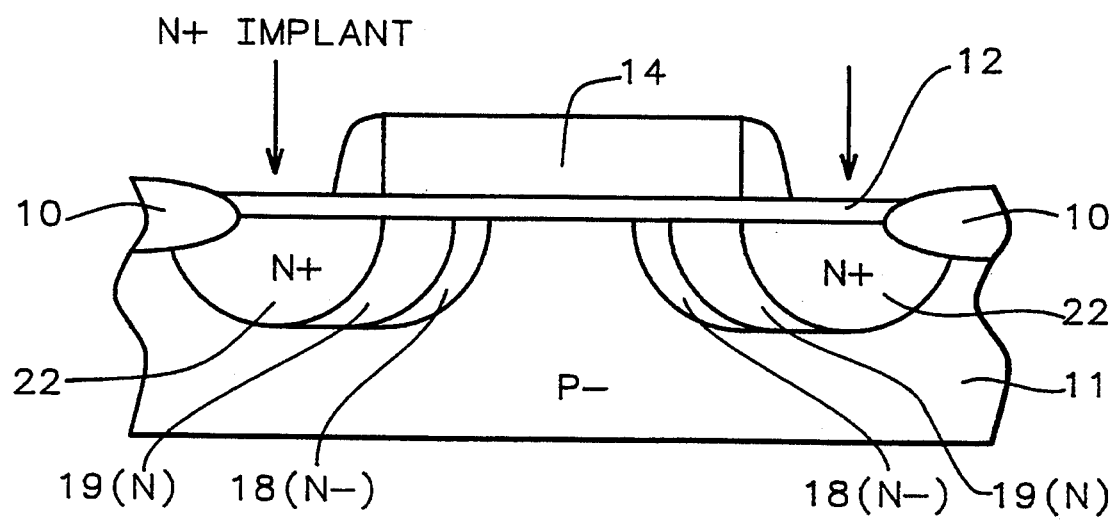

The source/drain structure of the MOS FET may now formed by the following steps. The FIGS. 5 through 7 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. Of course, it may be desirable to form N or P wells as is known in the art in making such CMOS FET integrated circuit devices.

FIG. 5, for example shows the ion implantations of N− dopants. Lithographic masks (not shown) may be required to protect the areas not to be subjected to that particular N− ion implantation. The formation of the lithographic masks are done by conventional lithography and etching techniques.

The next processing steps involving the multiple tilted angle ion implantation and the subsequent annealing or drive-in step are extremely critical for the successful manufacture of the sub-half micron feature size MOSFET integrated circuit device. It is important that the ion implantation equipment that is used allows for the a continuous rotational ion implantation at each chosen angle so that no shadowing affect occurs.

Figure 2A:
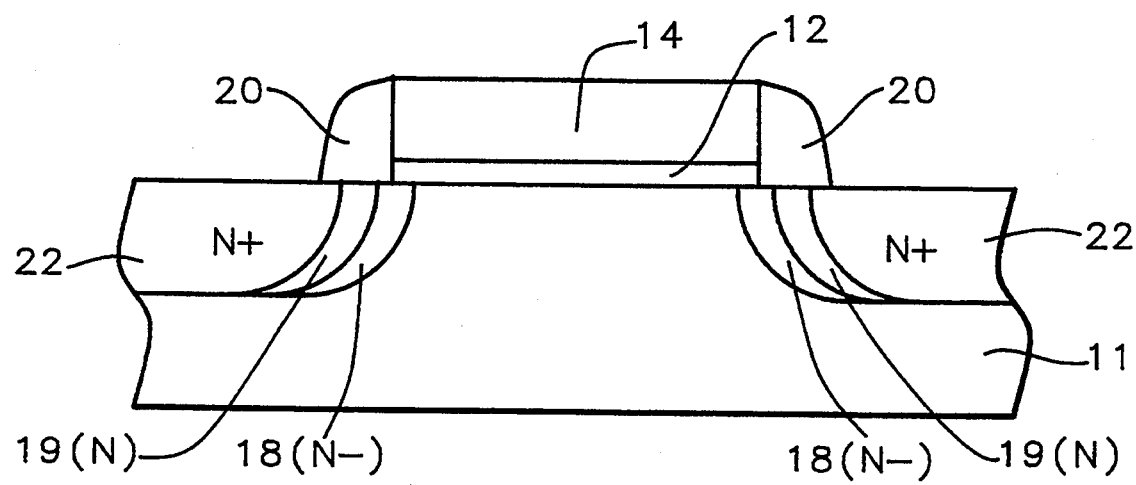
FIGS. 2A and 2B show a first embodiment schematic cross-sectional device having a lightly doped region made according to a method of the invention.
Figure 2B:
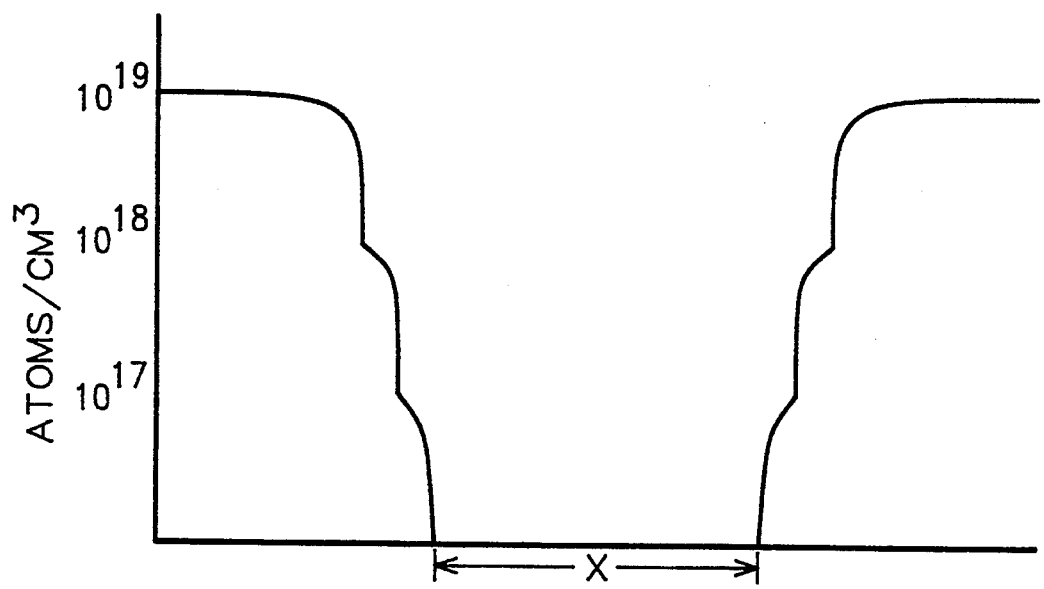

In our method shown in FIGS. 5 through 7 and resulting in FIGS. 2A and 2B, we select to use two N− ion implantations of different angles. For example, we can select 0° (vertical) and 35°; 0° and 45°; or 0° and 40°. Both N− ion implantations are normally phosphorus. The angles used can be optimized in terms of critical device performance and hot carrier performance. The dosage ranges from between about 0.3 E 13 to 3.0 E 13 atoms/cm$^2$ and energy of between about 50 KEV to 80 KEV. The N− LDD drive in of between about 870° to 930° C. for more than about 30 minutes is done after the N− LDD implantation. For example, if one chooses 35° LATID—the dosage might be 1.0 E 13; if 40° LATID dosage is chosen—the dosage might be 0.8 E 13; and if 45° LATID is chosen—the dosage might be 0.6 E 13 atoms/cm$^2$. The junction depth desired is about 0.1 to 0.25 micrometers, therefor the N− region 18 is desired to be about 5 E 17 to 5 E 18 atoms/cm$^3$.

After the successive ion implantations, the lightly doped regions are annealed or the ion drive-in process performed using a nitrogen ambient at a temperature between about 850° to 900° C. for a time of between about 30 to 60 minutes. The result of the critical steps is the formation of N− region 18 and N− region 19 shown in FIG. 5. Typically, for the gate length of 0.5 micrometers, the gate overlap to source/drain is between about 0.03 to 0.06 micrometers/side.

The dielectric spacer 20 is now to be formed followed by the completion of the lightly doped drain source/drain structures and may be better understood with reference to FIGS. 6. A low temperature silicon dioxide deposition is preferred such as through the chemical vapor deposition of tetraethoxysilane (TEOS) at a temperature in the range of between about 650° to 750° C. However, it is generally preferred to have the spacer formation layer at 700° C. The thickness of the dielectric silicon dioxide layer is between about 1500 to 2500 Angstroms and preferably 1800 to 2200 Angstroms. Anisotropic etching using a suitable etching ambient active specie, such as Fluorine for silicon oxide now is used to form the spacer structures 20.

Referring now to FIG. 7, the N+ source/drain ion implantation uses Arsenic ions, Ar75 with a dose of between about 1 E 15 to 1 E 16 atoms/cm.$^2$ and an energy of between about 50 to 80 Kev. to complete the source/drain regions 22 of the N channel lightly doped drain MOS FET integrated circuit device.

The heavily N+ doped regions 22 are annealed or the ion drive-in process are performed using nitrogen ambient at a temperature between about 800° to 920° C. for a time of between about 30 to 60 minutes. The anneal causes the movement of dopant ions in all directions including into the N− type region 19 in which due to this ion movement the region becomes N type as now seen in FIG. 7. The result of the critical steps is the formation of the N− region 18, N− region 19 and N+ region shown in FIG. 7.

The resulting structure of this FIGS. 4 through 7 process can also be more fully understood with reference to FIGS. 2A and 2B.

The angle implants place the ions further into the gate region without driving in the dopants. Hence, the resulting structure is more immune to hot carrier degradation.

Figure 3A:
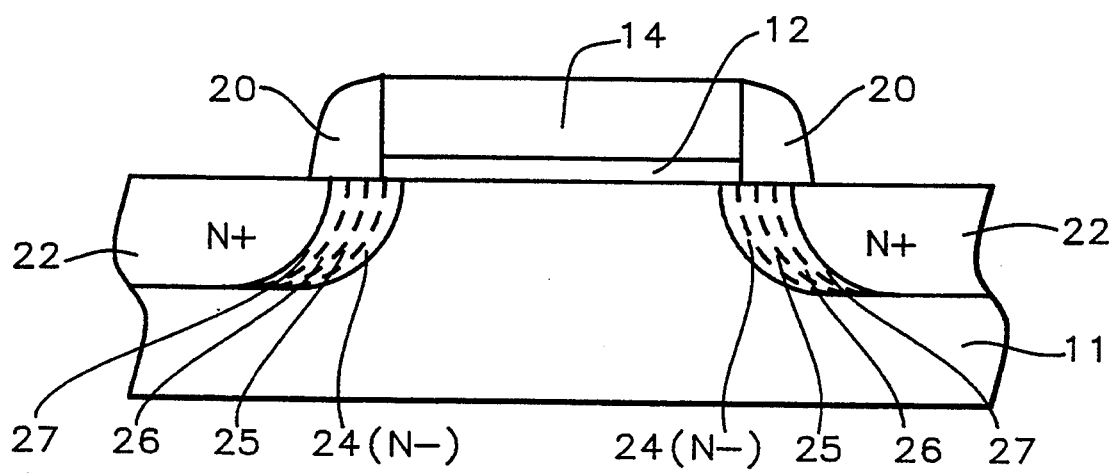
FIGS. 3A and 3B show a second embodiment schematic cross-sectional device having a lightly doped drain region made according to a method of the invention.
Figure 3B:
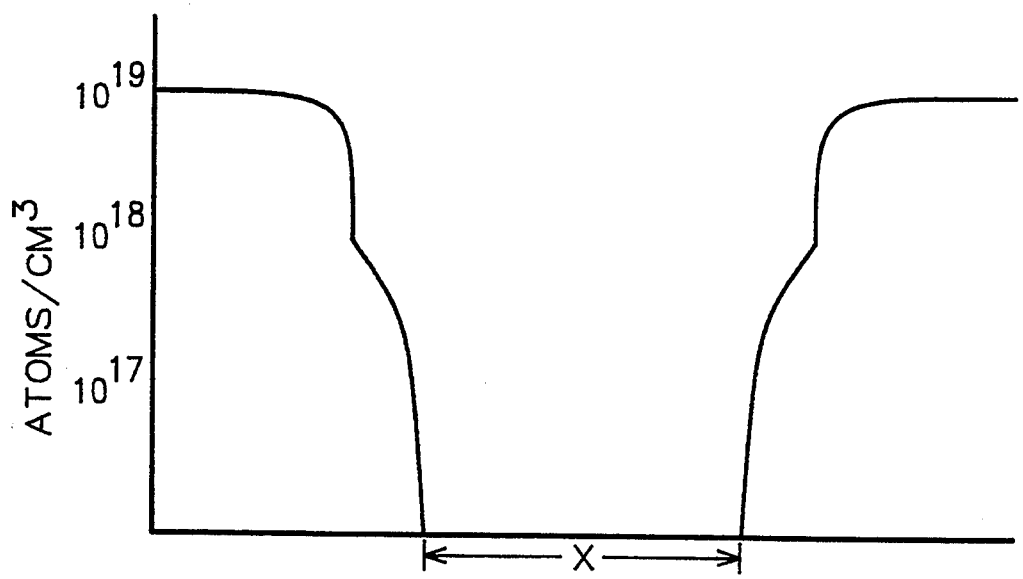
Figure 4:
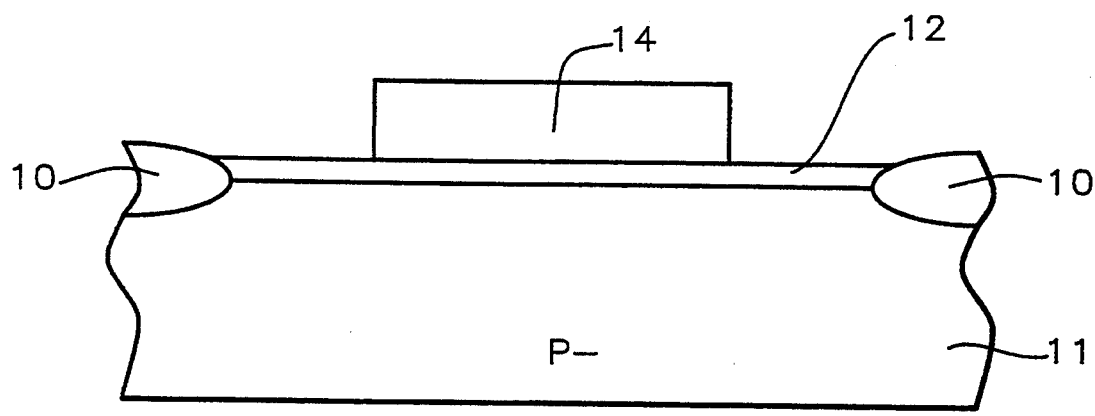
FIGS. 4 through 7 schematically illustrate the method for making a lightly doped drain MOS FET integrated circuit of the invention.

Referring now more particularly to FIGS. 3A and 3B, there a second method embodiment and resulting structure may be understood. The method of this embodiment is as is described in the above FIGS. 4 through 7 embodiment except for the use of more than two multiple tilted angle ion implantations to produce a gradual reduced dopant concentrations the lightly doped regions extend under the gate electrode structures. For example, FIG. 3A illustrates the use of four multiple tilted angle ion implantations of N type dopants. The tilted angles can be, for example 5°, 30°, 45° and 60° to produce regions 24, 25, 26 and 27. The FIGS. 3A and 3B show the condition after annealing or drive-in steps to activate the implanted ions and to position the dopants in their desired positions under the gate electrode structures that overlap the tailored LDD region.

The multiple angle implant of the FIGS. 3A and B embodiment gives the gate to source/drain overlap without degrading hot carrier performance. In the meantime, source/drain resistance is decreased.

The following TABLE is an example of the Prior Art versus the Invention structures wherein the concentration is given in atoms/cm$^3$.

TABLE

Figure 1A:
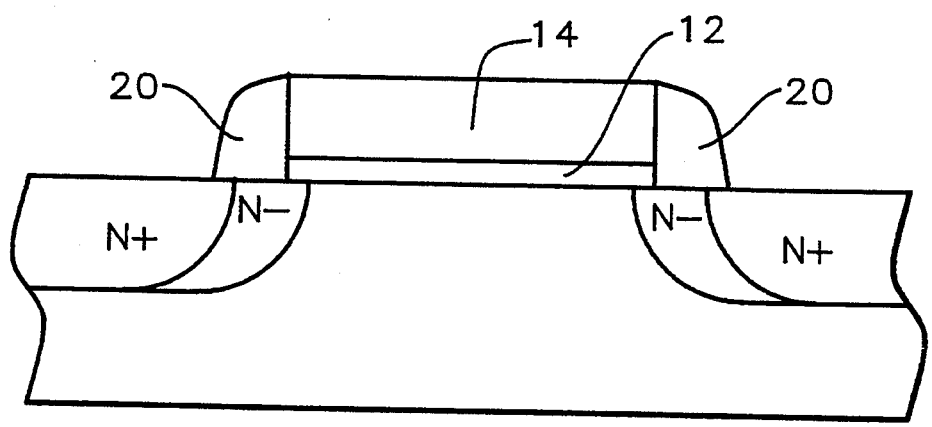
FIGS. 1A and 1B show a Prior Art schematic cross-sectional device having a lightly doped region.
Figure 1B:
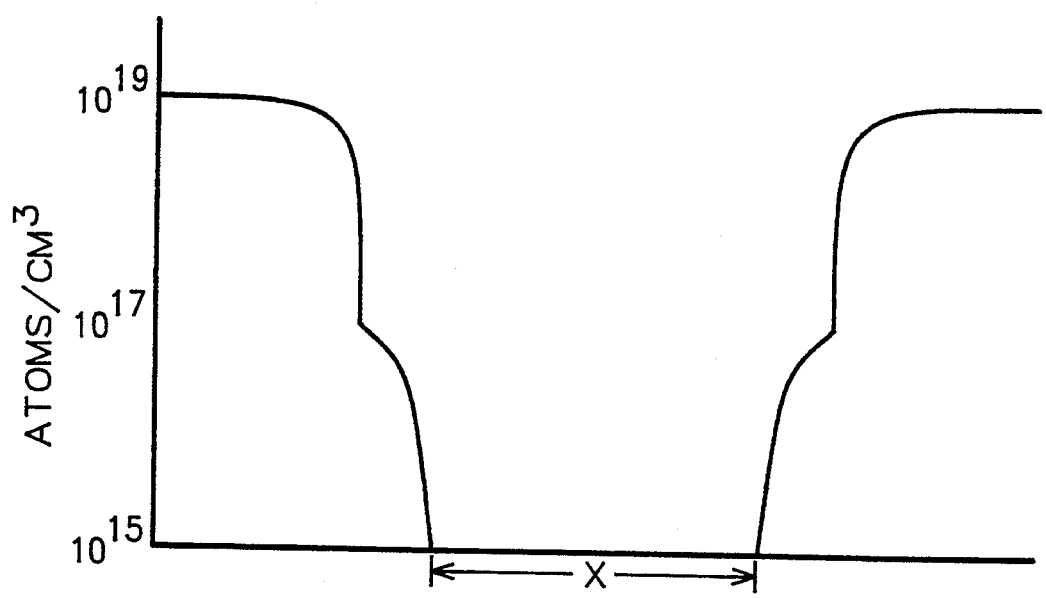

| FIGS. 1A & 1B | FIGS. 2A & 2B | FIGS. 3A & 3B |
|---|---|---|
| N− 1 E 17 | N− 1 E 17 | N− 1 E 17 |
|  |  | N 5 E 17 |
|  | N 1 E 18 | N 1 E 18 |
|  |  | N 5 E 18 |
| N+ 1 E 19 | N+ 1 E 19 | N+ 1 E 19 |

As can be seen from the TABLE, FIBS. 2A & 2B structures have gradual junction versus concentration profiles whereas FIGS. 1A & 1B is an abrupt profile between its two (N− and N+) regions. The FIGS. 2A & 2B and FIGS. 3A & 3B have been found to be not as susceptible to hot carrier degradation as is the FIGS. 1A & 1B structure. The FIGS. 3A & 3B is superior to that structure given in FIGS. 2A & 2B.

The passivation layer (not shown) is now deposited over the upper surfaces of the FIG. 7 structure. The appropriate connections now have to be made to electrically connect the various gate electrodes and source/drain elements to form the integrated circuit device. The contact (not shown) to the source/drain elements requires a contact etching step that forms openings to the source/drain elements through the passivation layer.

Appropriate metallurgy (not shown) is now deposited and patterned to electrically connect the gates and source/drain elements to form the integrated circuit device. This metallurgy is conventional and may be formed of polysilicon, aluminium, aluminium with dopants of copper and/or silicon, polycide and the like.

While the invention has been particularly shown and described with reference to the preferred embodiments, it will be understood by those skilled in the art that various changes in from and details may be made without departing from the spirit and scope of the invention. For example, while the detailed examples of the integrated circuits devices used N channel MOS FET, it is obvious that P channel, CMOS FET and BICMOS devices could be easily made.

What is claimed is:

1. A method for fabricating a lightly doped drain MOSFET integrated circuit device having reduced source/drain series resistance for increased saturation current comprising:

forming a pattern of gate electrode structures upon a semiconductor substrate which structures each includes a gate oxide and a polysilicon layer;

forming a pattern of lightly and successively more heavily doped regions in said substrate under said structures by multiple ion implantations wherein said multiple ion implantations are at least three different angles of successive greater amount from the vertical, the dosage of said implantations is between about 1 E 12 to 5 E 13 atoms/cm$^2$ and the acceleration potential of said implantations is between about 50 to 80 Kev;

annealing said lightly and successively more heavily doped regions at a temperature and time to cause dopant diffusion between said lightly doped to more heavily doped regions;

forming a dielectric spacer structure upon the sidewalls of each of said structures and over the adjacent portions of said substrate;

and forming a pattern of heavily doped regions in said substrate contiguous with said more heavily doped region adjacent to said dielectric spacer structure which is on the sidewalls of said structures and over the adjacent portions of said substrate.

2. The method of claim 1 wherein two of said multiple ion implantations are at 0° and 35° from the vertical and the dopant is of N type conductivity.

3. The method of claim 1 wherein two of said multiple ion implantations are at 0° and 45° from the vertical and the dopant is N type conductivity.

4. The method of claim 2 wherein as a result of said annealing the doping concentration is gradually extended under the gate region to reduce the hot carrier degradation while maintaining a heavy doping concentration in the source/drain regions of said source/drain structures to give higher saturation current.

5. The method of claim 1 wherein said annealing is performed at a temperature of between about 800° to 920° C. for a time of between about 30 to 60 minutes.

6. The method of claim 1 wherein the fabricated said device has a pattern of lightly and successively heavily doped regions that are N− and N regions which gradually extend in concentration from about 1 E 17 to 1 E 19 atoms/cm$^3$.

7. The method of claim 5 wherein the fabricated said device has a pattern of lightly doped N− and N regions which gradually extend in concentration from about 1 E 17 to 5 E 17 to 1 E 18 to 5 E 18 to 1 E 19 atoms/cm$^3$.

8. A method for fabricating a lightly doped drain MOSFET integrated circuit device having reduced source/drain series resistance for increased saturation current comprising:

forming a pattern of gate electrode structures upon a semiconductor substrate which structures each includes a gate oxide and a polysilicon layer;

forming a pattern of lightly and successively more heavily doped regions in said substrate under said structures by multiple ion implantations wherein said multiple ion implantations are at least three different angles of successive greater amount from the vertical, the dosage of said multiple implantations is between about 1 E 12 to 5 E 13 atoms/$cm^2$ and the acceleration power of said multiple implantations is between about 50 to 80 Kev;

annealing said lightly and successively more heavily doped regions at a temperature and time to cause dopant diffusion forming regions consisting of doping concentrations gradually varying from a lightly doped concentration of about 1 E 17 atoms/$cm^3$ to about 5 E 17 atoms/$cm^3$ to about 1 E 18 atoms/$cm^3$ to a more heavily doped concentration of about 1 E 18 atoms/$cm^3$;

forming a dielectric spacer structure upon the sidewalls of each of said structures and over the adjacent portions of said substrate;

forming a pattern of heavily doped regions in said substrate contiguous with said more heavily doped region adjacent to said dielectric spacer structure which is on the sidewalls of said structures and over the adjacent portions of said substrate.

9. A method for fabricating a lightly doped drain MOSFET integrated circuit device having reduced source/drain series resistance for increased saturation current comprising:

forming a pattern of gate electrode structures upon a semiconductor substrate which structures each includes a gate oxide and a polysilicon layer;

forming a pattern of lightly and successively more heavily doped regions in said substrate under said structures by multiple ion implantations wherein said multiple ion implantations are at least five different angles of successive greater amount from the vertical, the dosage of said multiple implantations is between about 1 E 12 to 5 E 13 atoms/$cm^2$ and the acceleration potential of said implantations is between about 50 to 80 Kev.;

annealing said lightly and successively more heavily doped regions at a temperature and time to cause dopant diffusion, between said lightly doped to more heavily doped regions so that as a result of said annealing and said multiple ion implantations there is a gradual reduced concentration as said lightly doped regions extend under said gate electrode structures is created;

forming a dielectric spacer structure upon the sidewalls of each of said structures and over the adjacent portions of said substrate; and forming a pattern of heavily doped regions in said substrate contiguous with said more heavily doped region adjacent to said dielectric spacer structure which is on the sidewalls of said structures and over the adjacent portions of said substrate.

10. The method of claim 9 wherein two of said multiple ion implantations are at 0° and 35° from the vertical.

11. The method of claim 9 wherein two of said multiple ion implantations are at 0° and 45° from the vertical.

12. The method of claim 9 wherein the fabricated said device has lightly and successively heavily doped regions which gradually extend in concentration from about 1 E 17 to 1 E 19 atoms/$cm^3$.

13. The method of claim 9 wherein as a result of said annealing the doping concentration is gradually extended under the gate region to reduce the hot carrier degradation while maintaining a heavy doping concentration in the source/drain regions of said source/drain structures to give higher saturation current.

* * * * *